(12) United States Patent
Kawasaki

(10) Patent No.: US 7,622,776 B2
(45) Date of Patent: Nov. 24, 2009

(54) SEMICONDUCTOR DEVICE

(75) Inventor: Hisao Kawasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 11/839,219

(22) Filed: Aug. 15, 2007

(65) Prior Publication Data

US 2008/0067563 A1 Mar. 20, 2008

(30) Foreign Application Priority Data

Sep. 15, 2006 (JP) ............................. 2006-250927

(51) Int. Cl.
*H01L 23/62* (2006.01)
(52) U.S. Cl. .................. 257/361; 257/E27.016
(58) Field of Classification Search ................. 257/194, 257/192, 289, 361–365, E27.016
See application file for complete search history.

(56) References Cited

U.S. PATENT DOCUMENTS

| | | | | |
|---|---|---|---|---|
| 5,162,258 | A * | 11/1992 | Lemnios et al. | 438/10 |
| 5,488,253 | A | 1/1996 | Matsuoka | |
| 6,020,613 | A | 2/2000 | Udomoto et al. | |
| 7,442,635 | B2 * | 10/2008 | Das et al. | 438/621 |
| 7,462,891 | B2 * | 12/2008 | Brar et al. | 257/194 |
| 2006/0118823 | A1 | 6/2006 | Parikh et al. | |
| 2006/0205161 | A1 * | 9/2006 | Das et al. | 438/284 |
| 2007/0187717 | A1 * | 8/2007 | Sadaka et al. | 257/192 |
| 2008/0048314 | A1 * | 2/2008 | Farrar et al. | 257/713 |
| 2008/0302559 | A1 * | 12/2008 | Leedy | 174/254 |
| 2008/0311682 | A1 * | 12/2008 | Adlerstein et al. | 438/3 |

FOREIGN PATENT DOCUMENTS

| | | |
|---|---|---|
| DE | 44 16 696 A1 | 11/1994 |
| JP | 2000-138236 | 5/2000 |
| JP | 2000-294568 | 10/2000 |
| JP | 2004-55869 | 2/2004 |

* cited by examiner

*Primary Examiner*—Nathan W Ha
(74) *Attorney, Agent, or Firm*—Oblon, Spivak, McClelland, Maier & Neustadt, L.L.P.

(57) ABSTRACT

A semiconductor device includes: a substrate including a compound semiconductor, a semiconductor layer formed on a surface of the substrate, a plurality of gate electrodes formed on the semiconductor layer, a plurality of source electrodes formed on the semiconductor layer, a plurality of drain electrodes formed on the semiconductor layer, a via hole configured to extend from a substrate side of the semiconductor layer to a rear surface of the source electrode, a ground electrode which is formed on an inner wall of the via hole and on the rear surface of the substrate and connects the plurality of source electrodes, and a first air bridge interconnection which is formed on a surface side of the source electrode and connects the plurality of source electrodes.

10 Claims, 1 Drawing Sheet

SEMICONDUCTOR DEVICE

CROSS-REFERENCE TO RELATED APPLICATIONS

This application is based upon and claims the benefit of priority from the prior Japanese Patent Application No. 2006-250927 filed on Sep. 15, 2006, the entire contents of which are incorporated herein by reference.

BACKGROUND OF THE INVENTION

1. Field of the Invention

The present invention relates to a semiconductor device such as a field effect transistor used as, for example, a high-frequency power amplifying device.

2. Description of the Related Art

In recent years, with advance in power of a high-frequency semiconductor element, high frequency characteristics and reliability in a field effect transistor (to be referred to as a Field Effect Transistor: abbreviated as an FET hereinafter) are required to be improved.

In general, in GaAs-FET, by a method of connecting a source electrode to a ground electrode through a via hole, a reduction in source inductance is achieved.

For example, in Japanese Patent Application Laid-Open No. 2004-55869, as shown in FIG. 1(b), thereof a via hole 116 reaching a source electrode 112 from a rear surface side of a semiconductor substrate 111 having a main surface on which the source electrode 112, a gate electrode 113, and a drain electrode 114 are formed. The source electrode 112 is grounded by a gold plating layer 115 formed inside the via hole 116 and the rear surface of the semiconductor substrate 111.

In this manner, each source electrode is connected through a via hole to make it possible to reduce a source inductance. Furthermore, since mechanical strength is deteriorated by forming the via hole, in order to improve mechanical strength against vertical stress, a method of shifting positions of via holes from each other is proposed.

However, in recent years, a semiconductor substrate used in the FET is thinned to have approximately several ten micrometers in consideration of an aspect ratio of a via hole and heat-radiation characteristics of the FET. Furthermore, a metal thickness of a ground electrode increases, in the above method, the vertical stress cannot be sufficiently moderated, and deterioration of handling performance, a decrease in yield caused by cracking of an FET chip, cannot be easily suppressed.

SUMMARY OF THE INVENTION

According to an aspect of the present invention, a semiconductor device includes a substrate including a compound semiconductor, a semiconductor layer formed on a surface of the substrate, a plurality of gate electrodes formed on the semiconductor layer, a plurality of source electrodes formed on the semiconductor layer, a plurality of drain electrodes formed on the semiconductor layer, a via hole configured to extend and a via hole configured to extend from a substrate side of the semiconductor layer to a rear surface of the source electrode. The device also includes a ground electrode which is formed on an inner wall of the via hole and on the rear surface of the substrate, connects the plurality of source electrodes, and a first air bridge interconnection which is formed on surface sides of the source electrode and connects the plurality of source electrodes.

It is to be understood that both the forgoing general description and the following detailed description are exemplary and explanatory only and are not restrictive of the invention, as claimed.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION OF THE EMBODIMENTS

Reference will now be made in detail to the present embodiment of the invention, an example of which is illustrated in the accompanying drawing. Wherever possible, the same reference numbers will be used throughout the drawings to refer to the same or like parts.

An embodiment of the present invention will be described below with reference to the accompanying drawings.

Figure 1:
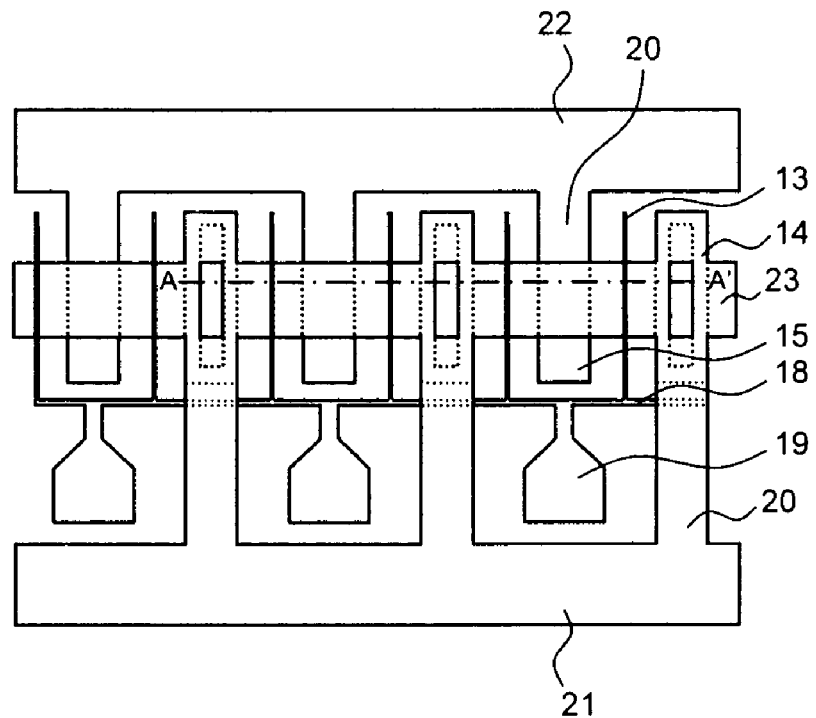
FIG. 1 is an upper view of an FET element according to an embodiment of the present invention.
Figure 2:
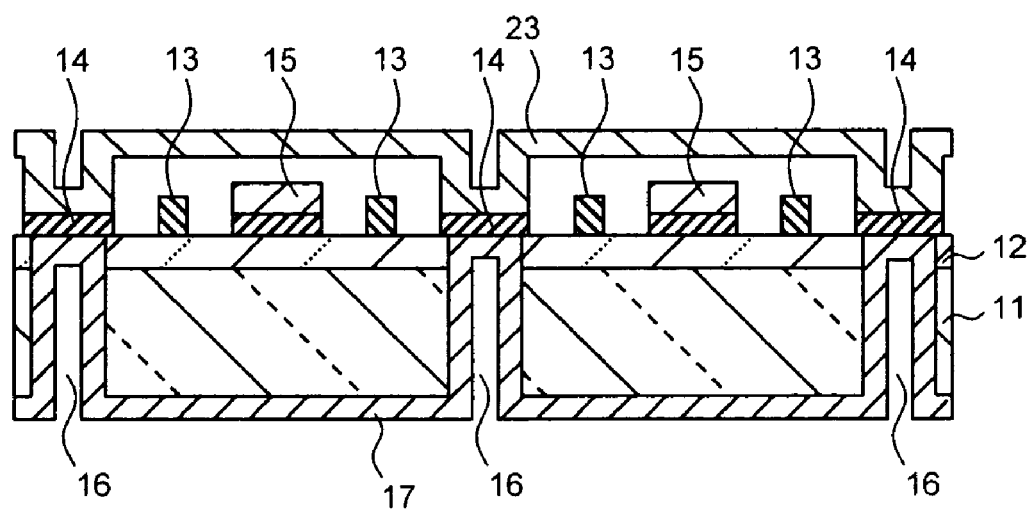
FIG. 2 is a sectional view along an A-A' line in FIG. 1.

FIG. 1 is an upper view of an FET element serving as a semiconductor device according to the present embodiment, and FIG. 2 is a sectional view along an A-A' line in FIG. 2. As shown in FIGS. 1 and 2, a semiconductor layer 12 obtained by forming an active element region (not shown) on a GaAs substrate 11 polished to be reduced in thickness to, for example, several 10 micrometers. A source electrode 14 and a drain electrode 15 are alternately arranged in parallel to each other, and a gate electrode 13 is arranged between the source electrode 14 and the drain electrode 15, to constitute a multi-finger structure on a surface of the semiconductor layer 12.

The source electrode 14 and the drain electrode 15 have a structure in which metal layers including, for example, Au/Pt/Ti are laminated on an ohmic contact by a metal layer including, for example, Pt/AuGe. A via hole 16 reaching the source electrode 14 is formed in the substrate 11. A ground electrode 17 formed by Au plating to have a thickness of, for example 5 to 30 μm is formed on an inner wall of the via hole 16 and a rear surface of the substrate 11.

The gate electrode 13 is connected to a gate pad 19 which is bonded to an external circuit and used for inputting/outputting data, through a gate interconnection 18. The source electrode 14 and the drain electrode 15 are connected to a source pad 21 and a drain pad 22 respectively, and the source pad 21 and the drain pad 22 bonded to an external circuit by an air bridge interconnection 20 formed by Au plating and having a thickness of, for example 5 to 30 μm, respectively. The air bridge interconnection 20 is arranged not to be in contact with the gate interconnection 15 or a passivation film (not shown) such as an SiN layer.

Furthermore, an air bridge interconnection 23 formed by Au plating is formed to connect the adjacent gate electrode 13. The air bridge interconnections 20 and 23 have sufficient distances with the semiconductor layer 12 not to generate a stray capacitance.

The air bridge interconnections 20 and 23 are formed as follows. For example, after each of the electrodes is formed, a resist is applied, patterning is performed, and gold deposition is applied. The resist is further applied, and patterning is performed. Thereafter, gold plating is performed. The resist is removed to form the air bridge interconnections 20 and 23. At this time, the source pad 21 and the drain pad 22 may be simultaneously formed. In this case, the thicknesses of Au plating layers of the air bridge interconnections 20 and 23 are almost equal to the thicknesses of Au plating layers of the source pad 21 and the drain pad 22. The Au plating layer may be formed on the source electrode 14 and the drain electrode 15.

In this manner, the air bridge interconnection 23 can be formed by using a plating method when forming the air bridge interconnection 20 and the metal interconnection such as another bonding interconnection. Therefore, new steps are not necessarily set to form the air bridge interconnection 23.

As described above, each of the source electrode 14 is connected to the ground electrode 17 through the via hole 16 formed from the rear surface side of the substrate 11. An adjacent source electrode 14 is connected by the air bridge interconnection 23 having a thickness approximately equal to that of the ground electrode 17. With this configuration, a source inductance can be reduced without reducing a contact are a between the source electrode 14 and the ground electrode 17.

Furthermore, when the semiconductor substrate is thinned, or when the metal layer of the ground electrode increases in thickness, vertical stress can be sufficiently moderated, because relatively thick Au layers are formed on upper and lower sides of the source electrode 14. Therefore, warpage of an FET chip can be prevented, and mechanical strength can be improved. Furthermore, when the substrate become stressed vertically during a manufacturing process of a semiconductor device or in handling of the substrate or an FET chip, cracks in the substrate and the FET chip are suppressed to make it possible to improve a yield.

This configuration is used in an FET element such as a HEMT (High Electron Mobility Transistor), a MESFET (Metal Semiconductor Field Effect Transistor), and a MOSFET (Metal oxide, semiconductor Field Effect Transistor). These FET elements are applied to a monolithic microwave integrated circuit including the FET elements. The monolithic microwave integrated circuit is used as, for example, a high frequency semiconductor device or a power conversion apparatus.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:
   a substrate including a compound semiconductor;
   a semiconductor layer formed on a surface of the substrate;
   a plurality of gate electrodes formed on the semiconductor layer;
   a plurality of source electrodes formed on the semiconductor layer;
   a plurality of drain electrodes formed on the semiconductor layer;
   a plurality of via holes, each of which is configured to extend from a rear surface of the substrate through the semiconductor layer to each of a rear side of the plurality of source electrodes;
   a ground electrode formed on an inner wall of the plurality of via holes and on a rear surface of the substrate, the ground electrode connecting to predetermined of the plurality of source electrodes; and
   a first air bridge interconnection formed on surface sides of the plurality of source electrodes, the first air bridge connecting to the predetermined of the plurality of source electrodes on surface sides of the predetermined of the plurality of source electrodes.

2. The semiconductor device according to claim 1, further comprising a bonding pad configured to be connected to an external circuit, a second air bridge interconnection connecting one of the plurality of source electrodes or one of the drain electrodes to the bonding pad.

3. The semiconductor device according to claim 1, wherein one of the plurality of source electrodes and one of the plurality of drain electrodes are alternately arranged in parallel to each other, one of the plurality of gate electrodes is arranged between one of the plurality of source electrodes and one of the plurality of drain electrodes, and the plurality of source electrodes, the plurality of drain electrodes and the plurality of gate electrodes constitute a multi-finger structure.

4. The semiconductor device according to the claim 1, wherein each of the ground electrode and the first air bridge interconnection include an Au plating layer.

5. The semiconductor device according to claim 4, wherein each of the Au plating layer have substantially equal thicknesses.

6. The semiconductor device according to claim 1, wherein the source electrodes and the drain electrodes have ohmic contacts formed on a substrate side.

7. The semiconductor device according to claim 1, wherein the substrate is a GaAs substrate.

8. The semiconductor device according to claim 1, wherein the semiconductor device is used in a monolithic microwave integrated circuit.

9. The semiconductor device according to claim 1, wherein the semiconductor device is used in a power conversion apparatus.

10. The semiconductor device according to claim 1, wherein the first air bridge interconnection and the ground electrode connect one of the plurality of source electrodes and a next of the one of the plurality of source electrodes respectively.

* * * * *